United States Patent [19]

Honda

[11] Patent Number: 5,317,154

[45] Date of Patent: May 31, 1994

[54] ELECTRON MICROSCOPE EQUIPPED WITH X-RAY ANALYZER

[75] Inventor: Toshikazu Honda, Tokyo, Japan

[73] Assignee: Joel Ltd., Tokyo, Japan

[21] Appl. No.: 27,090

[22] Filed: Mar. 5, 1993

[51] Int. Cl.[5] ............................................. H01J 37/244
[52] U.S. Cl. ..................................... 250/310; 250/397
[58] Field of Search ...................... 250/310, 397, 311

[56] References Cited

U.S. PATENT DOCUMENTS

| | | | |
|---|---|---|---|
| 4,724,320 | 2/1988 | Ino et al. | 250/310 |
| 4,910,399 | 3/1990 | Taira et al. | 250/310 |
| 5,270,544 | 12/1993 | Taira | 250/310 |

Primary Examiner—Paul M. Dzierzynski
Assistant Examiner—Keit T. Nguyen
Attorney, Agent, or Firm—Webb Ziesenheim Bruening Logsdon Orkin & Hanson

[57] ABSTRACT

An electron microscope equipped with an x-ray detector whose position is made different, depending on whether the detector is in use or not. The microscope prevents the irradiated position and the image from escaping even when the detector is moved into or out of a valve. A switch is operated to move the detector. The microscope has a deflection current-correcting circuit which supplies correcting currents to the deflection coils in step with the operation of the switch.

5 Claims, 2 Drawing Sheets

ELECTRON MICROSCOPE EQUIPPED WITH X-RAY ANALYZER

FIELD OF THE INVENTION

The present invention relates to an electron microscope equipped with an x-ray detector.

BACKGROUND OF THE INVENTION

In an electron microscope equipped with an x-ray detector, this detector is mounted close to the objective lens and also close to a specimen. As the detector is placed closer to the specimen, the solid angle is increased and thus the detection efficiency can be enhanced. Such an electron microscope is disclosed in, for example, U.S. Pat. No. 4,910,399. However, if this detector has a protective film on the front surface, and if the protective film is very thin, then it is necessary to insert the detector into a valve mounted inside a detecting unit except when the detector is in use. Normally, the position of the detector is made different, depending on whether it is in use or not. When the detector is not in use, the detector is placed remote from the objective lens.

More specifically, as shown in FIG. 3, a specimen 16 is held by a specimen holder 19 between the top polepiece 15a and the bottom polepiece 15b of the objective lens. An electron gun (not shown) emits an electron beam 17 toward the specimen 16. A specimen image is projected onto a fluorescent screen 18. An x-ray detector 33 is contained in a protective housing 32. The detector 33 is cooled by refrigerant supplied from a refrigerant tank 31. The detector 33 is accommodated in a valve 34. The detector 33 is placed at a first position remote from the specimen in order to protect the detector 33 when it is out of use. On the other hand, when the detector 33 is in use, it should be placed at a second position in proximity to the specimen 16 to increase the detection efficiency. Therefore, when x-rays from the specimen 16 should be detected by the detector 33, the valve 34 is opened. Then, the detector 33 is moved to the second position close to the specimen. In order to carry out the above movement, a roller 35 in contact with the protective housing 32 is provided. The roller 35 is connected to a motor 36. The motor 36 is controlled by a driving circuit 37. A switch 38 is connected to the driving circuit 37 for instructing the movement of the detector 33. When the position of the x-ray detector 33 is changed, the position on the specimen irradiated by the electron beam 17 is an error. Therefore, the brightness of the image formed on the fluorescent screen 18 decreases. Further, at the same time the image itself deviates or errors from a first position indicated by P to a second position indicated by Q in FIG. 4 for the following causes. First, the x-ray detector 33 is made of a nonmagnetic material, but a slight amount of residual magnetism exists. When the detector is cooled by the refrigerant, the surface is frozen. This frozen surface is electrically charged by the electron beam. Secondly, a magnetic substance is contained in the mechanism which moves the x-ray detector. The amounts of these errors are relatively small. Hence, where the size of the electron probe is large, as encountered in the prior art instrument, no problem occurs. However, where the size of the electron probe is small, the slight errors become serious, since it is difficult to locate the analyzed point at a desired point after the x-ray detector has been inserted.

SUMMARY OF THE INVENTION

It is an object of the present invention to provide an electron microscope which is equipped with an x-ray analyzer and prevents an error of the irradiated position and an error of the image even when the x-ray detector is moved into or out of a valve.

This object is achieved in accordance with the teachings of the invention by an electron microscope comprising: an electron gun producing an electron beam; a specimen to which said electron beam is irradiated; an x-ray detector for detecting the x-rays emanating from said specimen, said x-ray detector being movable between a first position remote from said specimen and a second position close to said specimen; a deflection means for deflecting said electron beam irradiated to said specimen; a correcting signal generating means for generating a correcting signal, wherein said correcting signal being so set that the error of the position on said specimen irradiated by said electron beam caused by moving said detector to the second position is compensated; a switching means for supplying said correcting signal to said deflection means.

In the novel electron microscope, the correcting currents are supplied to the beam deflection coils in step with the operation of the switch which is operated to move the detector into or out of the valve. This corrects the error of the irradiated position and the error of the image. In consequence, the image can be observed appropriately at all times. Also, the x-rays can be detected adequately. Other objects and features of the invention will appear in the course of the description thereof which follows.

DETAILED DESCRIPTION OF THE INVENTION

Figure 1:
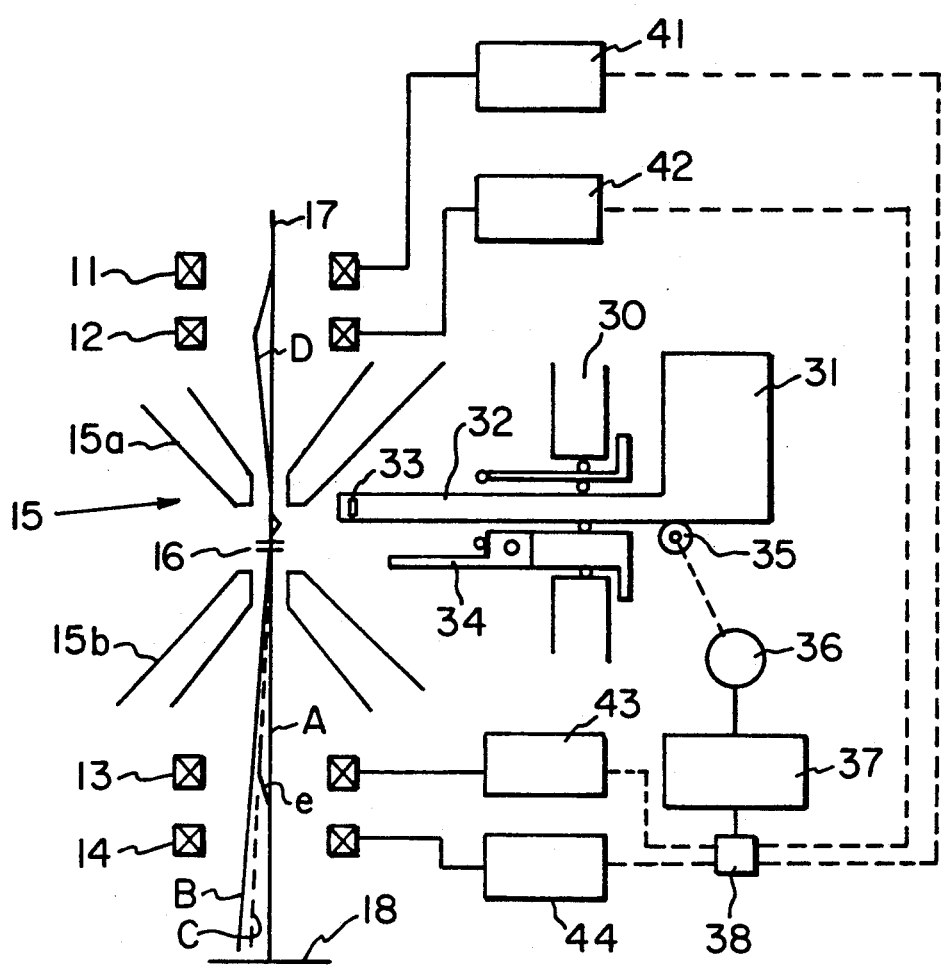
FIG. 1 is a diagram of an electron microscope according to the invention, the microscope being equipped with an x-ray detector.
Figure 2:
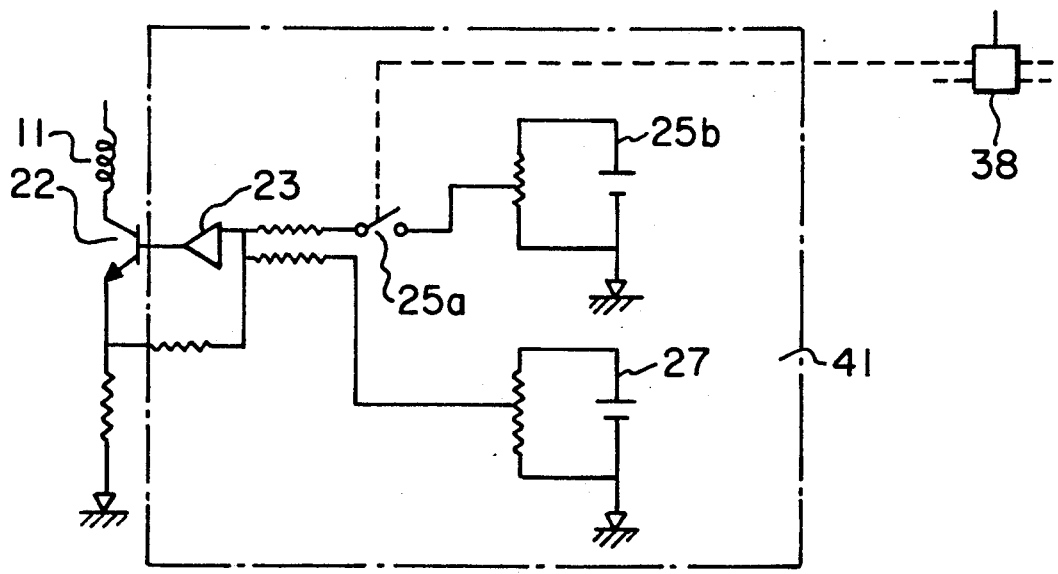
FIG. 2 is a diagram of the deflection signal generating unit 41 included in the microscope shown in FIG. 1.
Figure 3:
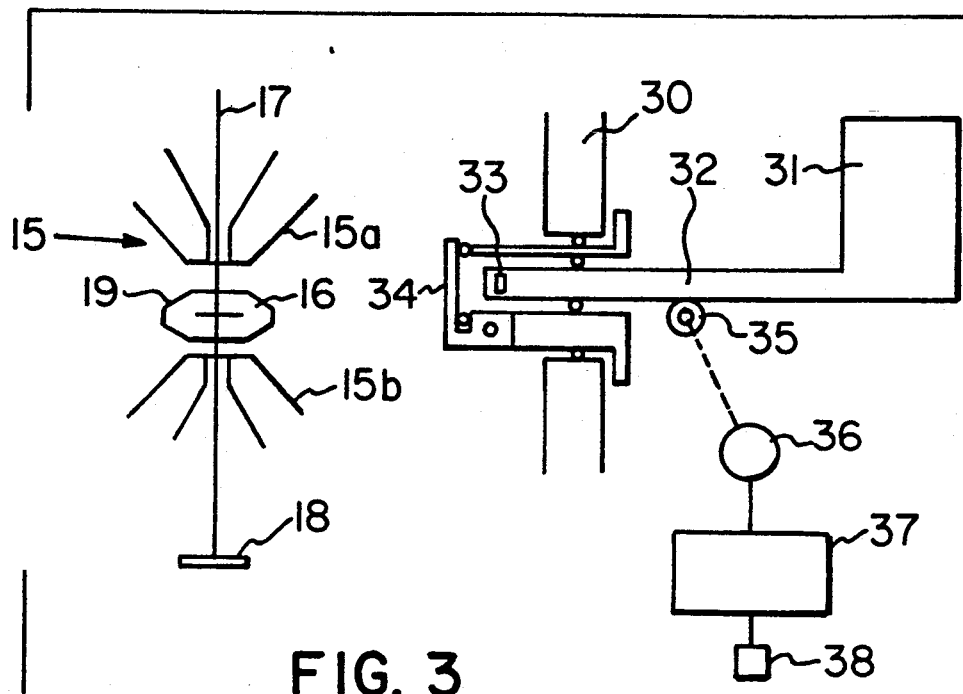
FIG. 3 is a diagram of the prior art electron microscope equipped with an x-ray detector.
Figure 4:
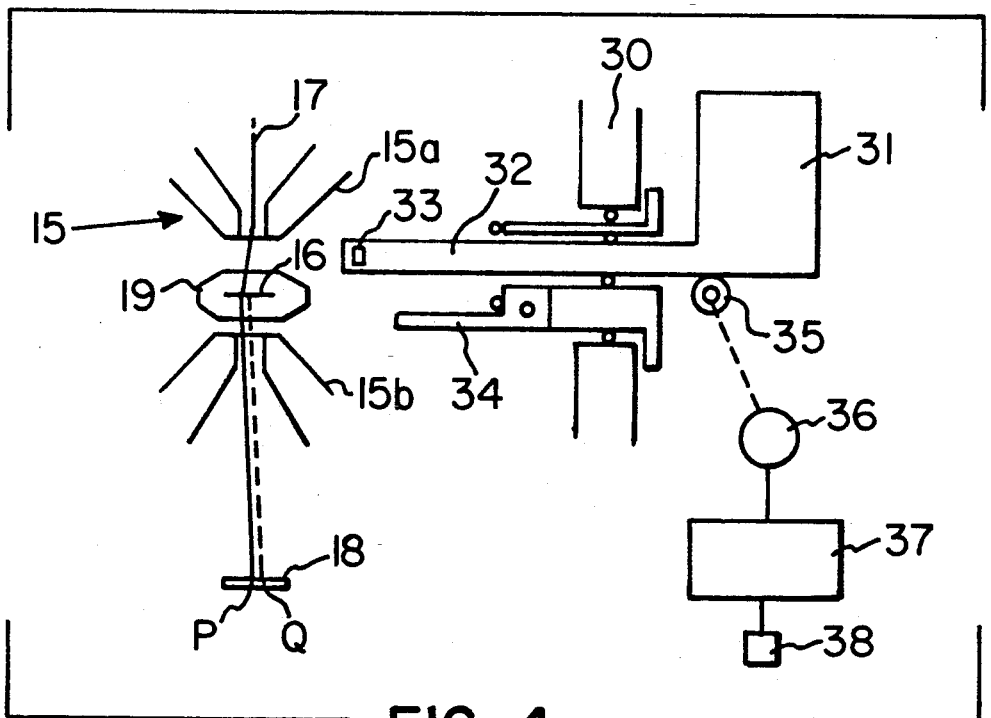
FIG. 4 is a diagram illustrating the irradiated position and error of an image.

Referring to FIG. 1, there is shown an electron microscope embodying the concept of the invention, the microscope being equipped with an x-ray detector 33. In FIG. 1, the same numerals are given to the same elements as in FIG. 3 and FIG. 4. An electron beam 17 from an electron gun (not shown) is condensed by an illuminating lens (not shown) positioned above an objective lens 15. A specimen 16 is inserted between a top polepiece 15a and bottom polepiece 15b of the objective lens 15. Two stages of deflection coils 11 and 12 are mounted between the illuminating lens and the objective lens 15. The electrons transmitted through the specimen 16 are projected onto a fluorescent screen 18 by a projection lens (not shown). Further, two stages of the deflection coils 13 and 14 are mounted below the objective lens 15. The microscope includes a first, a second, a third and a fourth deflection signal generating units 41, 42, 43 and 44. The output signals from the deflection signal generating units 41, 42, 43 and 44 are supplied to the deflection coils 11, 12, 13 and 14, respectively. The deflection signal generating unit 41 is particularly shown in FIG. 2. As shown in FIG. 2, the unit 41 comprises a first potentiometer 27, a second potentiometer 25b, an adding circuit 23 and switching circuit 25a. The first potentiometer 27 is provided for adjusting the position on the specimen irradiated by the electron beam 17. On the other hand, the second potentiometer 25b is provided for correcting the error of the irradiated position caused by moving the detector to the second position close to the specimen 16. Indicated by 22 is a transistor for controlling the current flowing through the coil 11 using the signal from the deflection signal generating units 41. The deflection signal generating units 42, 43 and 44 are not shown particularly. However, each of these deflection signal generating units has two potentiometers, an adding circuit and a switching circuit as the unit 41 has. The switch 38 is so linked electrically or mechanically to the switching circuit 25a that when the switch 38 is operated to move the detector 33 to the second position, the switching circuit 25a is automatically closed. On the contrary, when the switch 38 is operated to retract the detector 33 toward the first position, the switching circuit 25a is automatically opened. Similarly, the switch 37 is linked to each of the switching circuits in the signal generating units 42, 43 and 44.

In the above described embodiment, when x-ray detection is not needed, the detector 33 is placed in the first position remote from the specimen 16. To irradiate a desired position on the specimen 16 with electron beam 17, the output signal of the first potentiometer 27 is adjusted to a suitable position at first. Similarly, output signal of the first potentiometer of the unit 42 is adjusted. Further, both of the first potentiometers of the units 43 and 44 are adjusted to suitable condition to project image of desired portion of the specimen on the screen 18. When x-rays from the specimen 16 should be detected by the detector 33, the valve 34 is opened. Then, the switch 38 is operated to move the detector 33 to the second position close to the specimen 16. As a result, the motor 36 is driven under the control of the driving circuit 37. ,Then, the detector 33 is transported to the second position. Simultaneously, each of the switching circuits of the deflection signal generating units 41, 42, 43 and 44 are closed. Therefore, each of output signals of the deflecting signal generating units 41, 42, 43 and 44 is shifted by the amount corresponding to the signal from each of the second potentiometers. In other words, each of the switching circuits such as circuit 25a is so operated in step with said driving mechanism that each of the correcting signals from the deflection signal generating units 41, 42, 43 and 44 is automatically supplied to each of the reflection coils 11, 12, 13 and 14 when said detector is placed at the second position. Thus, correcting currents are supplied to deflection coils 11, 12, 13 and 14. As a result, the electron beam 17 is deflected by the deflection coils 11 and 12 as indicated by D to prevent the error of the irradiated position on the specimen 16. The electron beam is also deflected by the deflection coils 13 and 14 below,,, the objective lens as indicated by e to prevent the error of the image.

In FIG. 1, B indicates uncorrected deflection of the electron beam which causes the error of the position irradiated by the electron beam 17 and decrease of the brightness of the image. Further, in FIG. 1, C indicates uncorrected error of the image. These errors and decreases can be corrected, and appropriate state can be reproduced. The correcting signals which should be supplied to the deflection coils are predetermined empirically. Once these signals are set into each of the second potentiometers 25b, the error of the irradiated position and the error of the image can be subsequently prevented, irrespective of whether the detector is moved into or out of the valve.

In the above embodiment, two stages of deflection coils are used below the illuminating lens, and two stages of deflection coils are employed below the objective lens. Since the deflection angles are small, the correction can be made almost satisfactorily by one stage of deflection coil.

In the above embodiment, potentiometers are used for generating correcting signals. However, memory means storing the digital correction signals can be used instead.

In the above embodiment, a first deflection means is provided above the specimen for correcting the error of the irradiated position on the specimen and a second deflection means is provided below the objective lens for correcting the error of the image. However, only the first deflection means can be used when it is needed to correct only the error of the irradiated position.

As described above, in the novel instrument, the error of the irradiated position on the specimen or the error of the image which are on the order of 1 $\mu$m can be suppressed to approximately 1 nm.

Having thus described my invention with the detail and particularity required by the Patent Laws, what is desired and claimed to be protected by Letters Patent is set forth in the following claims.

What is claimed is:

1. An electron microscope comprising:
   an electron gun for producing an electron beam;
   a specimen to which said electron beam is irradiated;
   an x-ray detector for detecting the x-rays emanating from said specimen, wherein said x-ray detector being moved between a first position remote from said specimen and a second position close to said specimen and an error of an irradiated position on said specimen caused by moving said X-ray detector at said second position;
   a deflection means for deflecting said electron beam irradiated to said specimen;
   a correcting signal generating means for generating a correcting signal, wherein said correcting signal is so set that the error of the position on said specimen irradiated by said electron beam caused by moving said X-ray detector to the second position is compensated; and
   a switching means for supplying said correcting signal to said deflecting means.

2. An electron microscope according to claim 1, said electron microscope further comprising a driving means for moving said x-ray detector between said first position remote form said specimen and said second position close to said specimen.

3. An electron microscope according to claim 2, said switching means is so operated in step with said driving means that said correcting signal is automatically supplied to said deflection means when said detector is placed at the second position.

4. An electron microscope comprising:
   an electron gun for producing an electron beam;
   an objective lens having an upper polepiece and a bottom polepiece;

a specimen to which said electron beam is irradiated, said specimen being placed between said upper polepiece and said bottom polepiece;

an x-ray detector for detecting the x-rays emanating from said specimen;

a fluorescent screen for detecting an image transmitted through said specimen;

a driving means for moving said x-ray detector between a first position remote from said specimen and a second position close to said specimen and an error of an irradiated position on said specimen and an error of an image position on said fluorescent screen are caused by moving said X-ray detector at said position;

a first deflection means for deflecting said electron beam irradiated to said specimen, said first deflection means being positioned above said specimen;

a first correcting signal generating means for generating a first correcting signal, wherein said first correcting signal is so set that the error of the position on said specimen irradiated by said electron beam caused by moving said X-ray detector to the second position is compensated;

a first switching means for supplying said first correcting signal to said first deflecting means;

a second deflection means for deflecting electron beam transmitted through said specimen, said second deflection means being positioned below said objective lens;

a second correcting signal generating means for generating a second correcting signal, wherein said second correcting signal is so set that the error of the image projected on said fluorescent screen caused by moving said detector to the second position is compensated; and a second switching means for supplying said second correcting signal to said second deflecting means.

5. An electron microscope according to claim 4, said first switching means is so operated in step with said driving means that said first correcting signal is automatically supplied to said first deflection means when said detector is placed at the second position, and said second switching means is so operated in step with said driving means that said second correcting signal is automatically supplied to said second deflection means when said detector is placed at the second position.

* * * * *

UNITED STATES PATENT AND TRADEMARK OFFICE
CERTIFICATE OF CORRECTION

PATENT NO. : 5,317,154
DATED : May 31, 1994
INVENTOR(S) : Toshikazu Honda

It is certified that error appears in the above-indentified patent and that said Letters Patent is hereby corrected as shown below:

Title page, item [73] Assignee, "Joel" should read --JEOL--.

Title page, add --Foreign Application Priority Data
Mar. 9, 1992 [JP] Japan ... 4-050329--.

Column 2 Line 29 after "move" delete ",".

Column 3 Line 43 after "37." delete ",".

Column 3 Line 61 after "below" delete ",,,".

Claim 1 Line 38 Column 4 after "detecting" delete "the".

Claim 2 Line 58 Column 4 "form" should read --from--.

Claim 4 Line 4 Column 5 after "detecting" delete "the".

Claim 4 Line 15 Column 5 before "position" insert --second--.

Signed and Sealed this

Thirteenth Day of September, 1994

Attest:

BRUCE LEHMAN

*Attesting Officer*   *Commissioner of Patents and Trademarks*